United States Patent
Goerbing

(10) Patent No.: US 10,068,743 B2
(45) Date of Patent: Sep. 4, 2018

(54) ION SOURCE DEVICES AND METHODS

(71) Applicant: Infineon Technologies AG, Neubiberg (DE)

(72) Inventor: Frank Goerbing, Dresden (DE)

(73) Assignee: Infineon Technologies AG, Neubiberg (DE)

(*) Notice: Subject to any disclaimer, the term of this patent is extended or adjusted under 35 U.S.C. 154(b) by 113 days.

(21) Appl. No.: 14/960,496

(22) Filed: Dec. 7, 2015

(65) Prior Publication Data

US 2016/0086763 A1 Mar. 24, 2016

Related U.S. Application Data

(62) Division of application No. 13/591,291, filed on Aug. 22, 2012, now Pat. No. 9,257,285.

(51) Int. Cl.

| | |
|---|---|
| *H01L 21/425* | (2006.01) |
| *H01J 37/08* | (2006.01) |
| *H01J 37/317* | (2006.01) |
| *H01J 27/08* | (2006.01) |
| *H01L 21/265* | (2006.01) |

(52) U.S. Cl.
CPC .............. *H01J 37/08* (2013.01); *H01J 27/08* (2013.01); *H01J 37/317* (2013.01); *H01J 37/3171* (2013.01); *H01L 21/265* (2013.01)

(58) Field of Classification Search
CPC .......... H01J 37/08; H01J 27/08; H01J 37/317; H01J 37/3171; H01L 21/265
USPC .................................. 438/514; 257/E21.473
See application file for complete search history.

(56) References Cited

U.S. PATENT DOCUMENTS

| | | | |
|---|---|---|---|
| 5,306,921 A * | 4/1994 | Tanaka | H01J 27/08 250/423 R |
| 9,257,285 B2 * | 2/2016 | Goerbing | H01L 21/265 |
| 2004/0066128 A1 | 4/2004 | Suguro | |
| 2007/0278417 A1 * | 12/2007 | Horsky | H01J 27/205 250/427 |
| 2008/0105828 A1 * | 5/2008 | Hatem | C01B 3/0026 250/426 |
| 2010/0176306 A1 * | 7/2010 | Lin | H01J 37/08 250/424 |
| 2011/0139613 A1 | 6/2011 | Ikejiri et al. | |
| 2012/0177556 A1 * | 7/2012 | Graeve | C01B 35/04 423/252 |

OTHER PUBLICATIONS

Goebel et al.: "Lanthanum hexaboride hollow cathode for dense plasma production", Review of Scientific Instruments, Apr. 1978, 5 pages, vol. 49.

* cited by examiner

*Primary Examiner* — Thien F Tran
(74) *Attorney, Agent, or Firm* — Viering, Jentschura & Partner mbB

(57) ABSTRACT

An ion source includes a chamber defining an interior cavity for ionization, an electron beam source at a first end of the interior cavity, an inlet for introducing ionizable gas into the chamber, and an arc slit for extracting ions from the chamber. The chamber includes an electrically conductive ceramic.

17 Claims, 3 Drawing Sheets

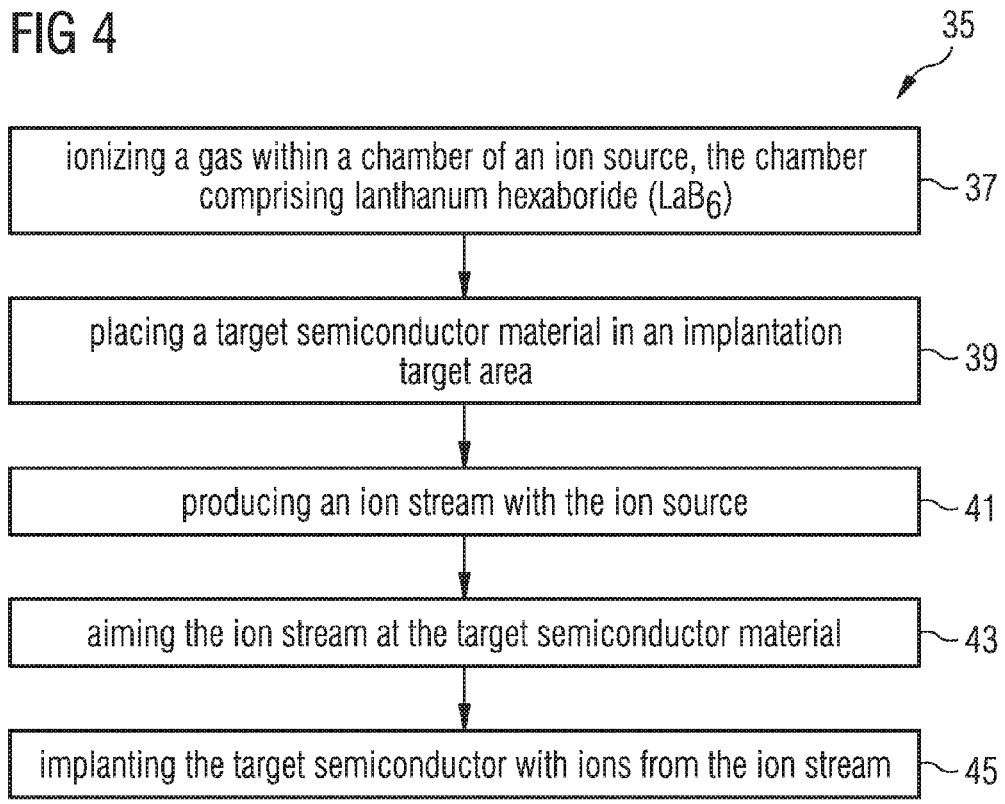
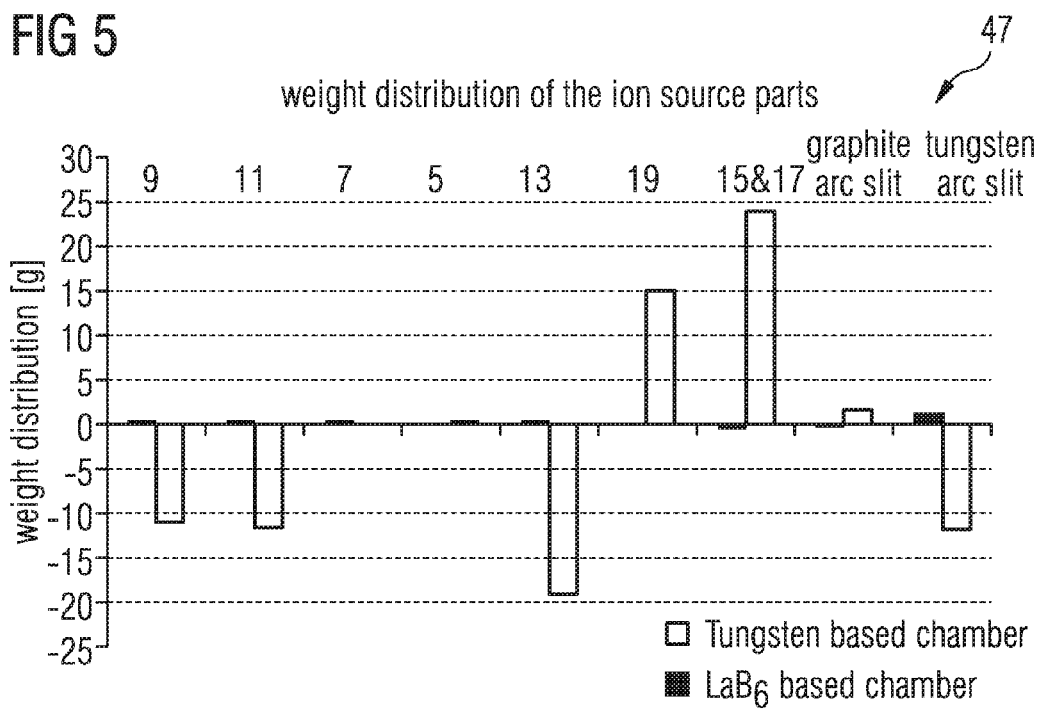

ION SOURCE DEVICES AND METHODS

RELATED APPLICATION

This application is a divisional of U.S. patent application Ser. No. 13/591,291, entitled "ION SOURCE DEVICES AND METHODS", filed on Aug. 22, 2012, which is incorporated herein by reference in its entirety.

FIELD OF THE DISCLOSURE

This disclosure relates to devices and methods for electrically manipulating particles and, more particularly, to devices and methods for producing ions.

BACKGROUND

An ion source is a device that is used to create charged particles, or ions. Ions have several applications in both science and industry. An ion source may, for example, be used in conjunction with various spectrometers, particle accelerators, or ion implanters. Semiconductor doping, in particular, is an important application of ion sources, doped semiconductors forming a foundation of modern electronics.

Conventional ion sources tend to have a limited life span. Depending on the plasma used, the useful life span of a conventional ion source can be about 40 hours.

SUMMARY

In a first implementation, an ion source includes a chamber defining an interior cavity for ionization, an electron beam source at a first end of the interior cavity, an inlet for introducing ionizable gas into the chamber, and an arc slit for extracting ions from the chamber. The chamber includes an electrically conductive ceramic.

One or more of the following features may be included. The chamber may be at least partially enveloped by a second material. The second material may include graphite. The electrically conductive ceramic may include a hexaboride substance. The electrically conductive ceramic may be lanthanum hexaboride ($LaB_6$), calcium hexaboride ($CaB_6$), cerium hexaboride ($CeB_6$), and/or europium hexaboride ($EuB_6$). The chamber may further include a second hexaboride substance. The second hexaboride substance may be, for instance, calcium hexaboride ($CaB_6$), cerium hexaboride ($CeB_6$), and/or europium hexaboride ($EuB_6$). The electron beam source may be an electron producing cathode having tungsten (W), molybdenum (Mo), and/or tantalum (Ta).

In another implementation, a method for doping a semiconductor includes ionizing a gas within a chamber of an ion source, placing a target semiconductor material in an implantation target area, producing an ion stream with the ion source, aiming the ion stream at the target semiconductor material, and implanting the target semiconductor with ions from the ion stream. The chamber includes an electrically conductive ceramic.

One or more of the following features may be included. The ion source may include an interior cavity for ionization defined by the chamber, an electron beam source at a first end of the interior cavity, an inlet for introducing an ionizable gas into the chamber, and an arc slit for extracting ions from the chamber. The ion stream may be produced such that it is relatively free of heavy metals. The electrically conductive ceramic may include a hexaboride substance. The electrically conductive ceramic may be lanthanum hexaboride ($LaB_6$), calcium hexaboride ($CaB_6$), cerium hexaboride ($CeB_6$), and/or europium hexaboride ($EuB_6$). The electrically conductive ceramic may be lanthanum hexaboride ($LaB_6$). The lanthanum hexaboride ($LaB_6$) in the chamber may amplify the ion stream. The gas may be a halogen gas. The halogen gas may be germanium tetrafluoride ($GeF_4$).

In yet another implementation, a method of producing ions includes energizing an ion source, introducing a gas comprising Fluorine (F) into a chamber through an inlet, and extracting ions from an arc slit. The ion source includes a chamber defining an interior cavity for ionization, an electron beam source at a first end of the interior cavity, an inlet for introducing ionizable gas into the chamber, the inlet for introducing ionizable gas into the chamber, and an arc slit for extracting ions from the chamber. The chamber includes an electrically conductive ceramic.

One or more of the following features may be included. The gas may be germanium tetrafluoride ($GeF_4$). The chamber may be at least partially enveloped by a second material. The second material may include graphite. The electrically conductive ceramic may include a hexaboride substance. The electrically conductive ceramic may be lanthanum hexaboride ($LaB_6$), calcium hexaboride ($CaB_6$), cerium hexaboride ($CeB_6$), and/or europium hexaboride ($EuB_6$). The electrically conductive ceramic may be lanthanum hexaboride ($LaB_6$). The chamber may further include a second hexaboride substance. The second hexaboride substance may be, for instance, calcium hexaboride ($CaB_6$), cerium hexaboride ($CeB_6$), and/or europium hexaboride ($EuB_6$). The electron beam source may be an electron producing cathode having tungsten (W), molybdenum (Mo), and/or tantalum (Ta).

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 4 depicts a method for doping a semiconductor according to an aspect of the disclosure; and FIG. 5 compares the increase and decrease in weight of several components between the ion sources described with reference to FIG. 1 and FIG. 2 when using germanium tetrafluoride ($GeF_4$).

DETAILED DESCRIPTION

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

Figure 1A:
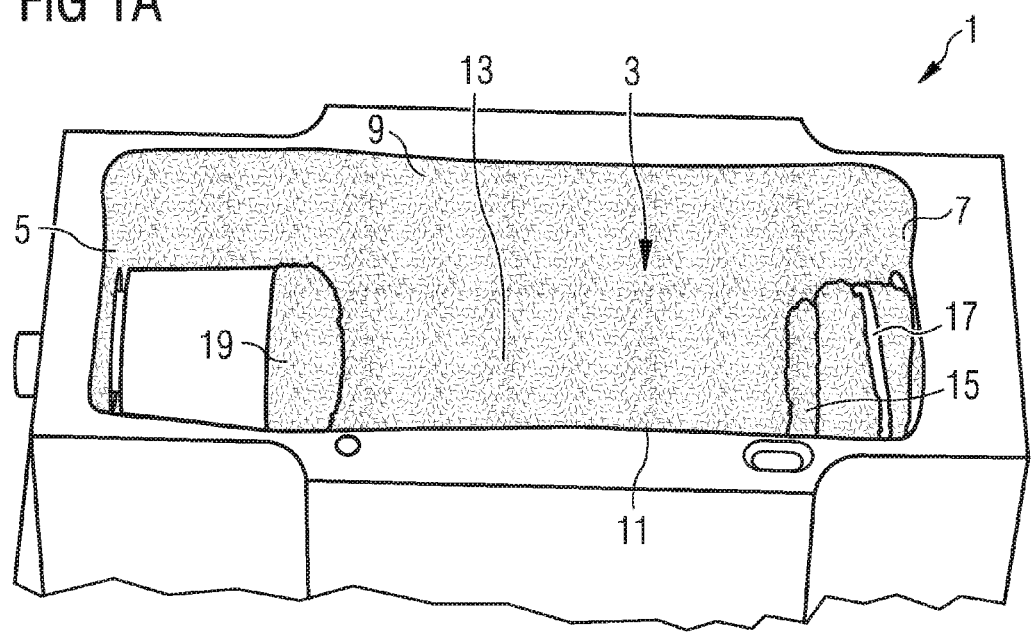
FIG. 1A shows an ion source and FIG. 1B shows a detailed view of the cathode of FIG. 1A.
Figure 1B:
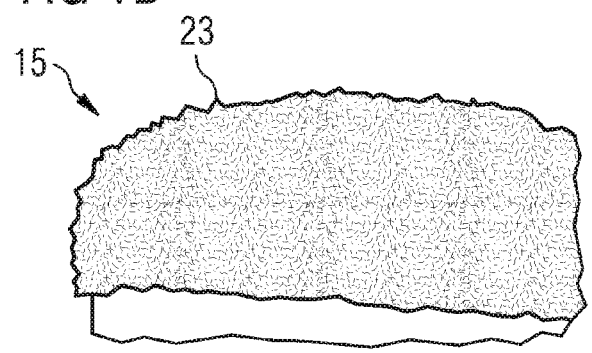

FIG. 1A shows an ion source and FIG. 1B shows a detailed view of the cathode of FIG. 1A. In particular, FIG. 1A shows ion source 1 which includes chamber 3, cathode 15, and repeller electrode 19. Chamber 3 has four side walls 5, 7, 9, 11 and bottom 13, with repeller electrode 19 located along side wall 5, while cathode 15 and cathode nut 17 are located opposite thereof along side wall 7. In operation, cathode 15 provides a stream of electrons within chamber 3. Cathode 15 and repeller electrode 19 are often constructed from tungsten (W) or from alloys thereof. Bottom 13, and side walls 5, 7, 9, and 11, in this example, are constructed from molybdenum (Mo), and are depicted after some operational use.

In one or more embodiments, the interior of an ion source may be electrically conductive in order to be capable of conducting electron flux away from the interior.

During use, a source gas such as germanium tetrafluoride ($GeF_4$) is introduced into chamber 3 to generate plasma. The halogen is depicted as having reacted with bottom 13, and side walls 5, 7, 9, 11 during operation, causing ablation therefrom. A portion of the ablated materials then re-deposit themselves onto cathode 15, and repeller electrode 19.

Needle crystals 23, as shown in FIG. 1B for example, have grown by way of such deposition onto cathode 15, and as a result electrons no longer emerge directly from cathode 15, but rather are released from cathode 15 through needle crystals 23. As a result of the electrons no longer being able to be released directly from cathode 15, the output of ion source 1 can be diminished. Where this power loss cannot be operationally readjusted in ion source 1, costly maintenance must be performed on ion source 1, thus potentially rendering the ion source out of service for a significant portion of time.

Figure 2:
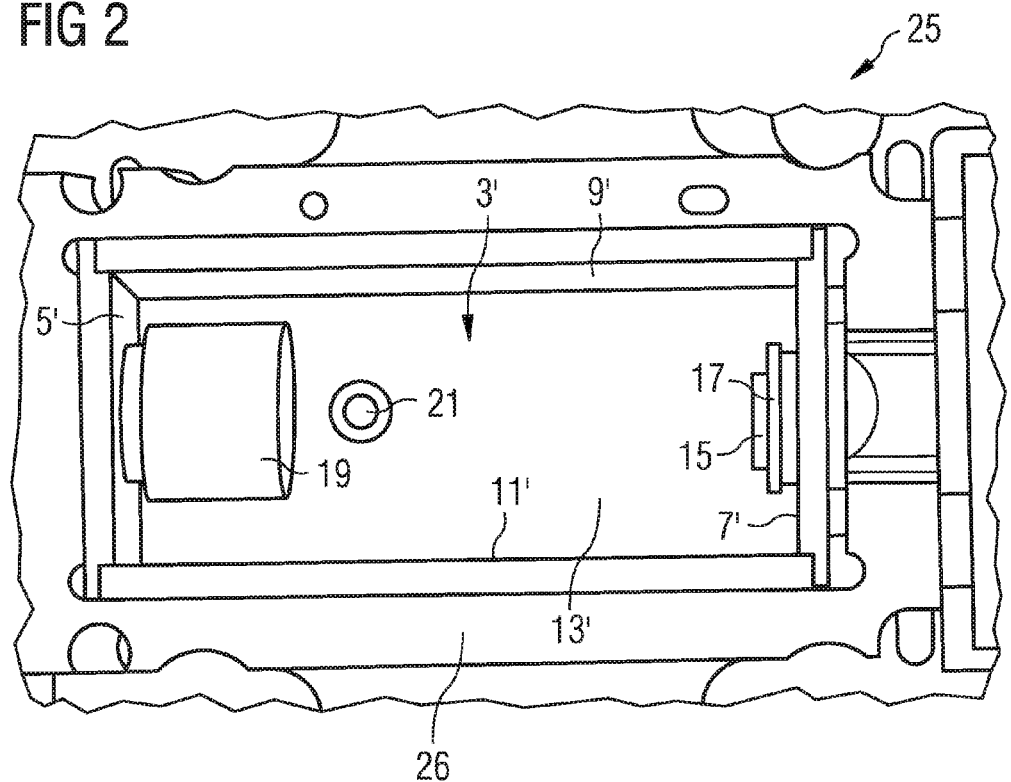
FIG. 2 shows an ion source according to an aspect of the disclosure.

FIG. 2 shows an ion source according to an aspect of the disclosure. Similar to FIG. 1, ion source 25 in FIG. 2 includes chamber 3' including bottom 13', walls 5', 7', 9', and 11'. A cathode 15 for producing an electron beam, and repeller electrode 19 are also shown. An inlet 21 for introducing ionizable gas into chamber 3' is also detailed in FIG. 2. In contrast to FIG. 1, chamber 3' in FIG. 2 is made with an electrically conductive ceramic. By way of example chamber 3' is made with lanthanum hexaboride ($LaB_6$). It is, however, understood that chamber 3' may be made with other electrically conductive ceramics. For instance, it is contemplated that compositions with lanthanum hexaboride ($LaB_6$) and other hexaborides such as calcium hexaboride ($CaB_6$), cerium hexaboride ($CeB_6$), and/or europium hexaboride ($EuB_6$) may be suitable within the scope of the disclosure and may provide advantages over using lanthanum hexaboride ($LaB_6$) or other electrically conductive ceramics exclusively. Similarly, cathode 15 and repeller electrode 19 may be made of materials such as tungsten (W), molybdenum (Mo), tantalum (Ta), or from combinations thereof. Chamber 3' is enveloped along bottom 13', and side walls 5', 7', 9', 11' with a different material 26 such as graphite.

Figure 3:
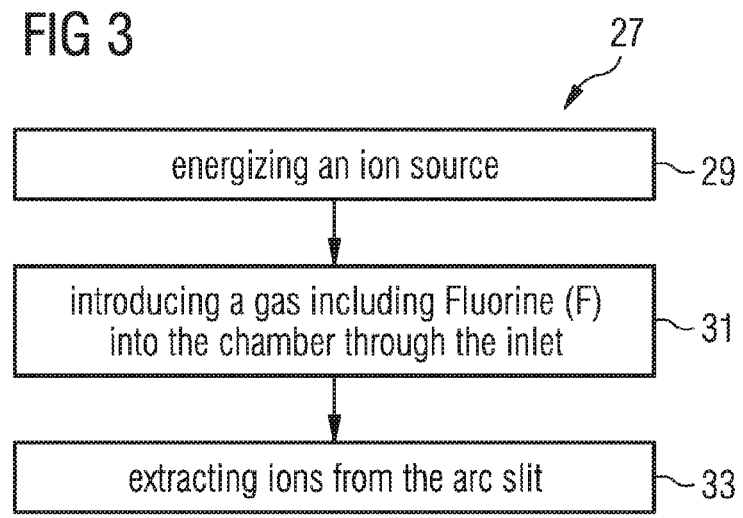
FIG. 3 depicts a method of producing ions such as for ion implantation according to an aspect of the disclosure.

Chamber 3' defines an interior cavity for ionization, while the top side of chamber 3' is shown open. Typically the top side may provide an arc slit where ions can be extracted from chamber 3' during operation. FIG. 3 depicts a method of producing ions such as for ion implantation according to an aspect of the disclosure. In particular, method 27 includes, 29, energizing ion source, 31, introducing a gas including Fluorine (F) into the chamber through the inlet, and 33, extracting ions from the arc slit. In introducing 31 a gas including Fluorine (F) into chamber 3' through inlet 21, the chemical compound may be, for example, germanium tetrafluoride ($GeF_4$). Germanium tetrafluoride ($GeF_4$) is a common ionizable gas used in ion implantation systems.

During use, an applied halogen such as germanium tetrafluoride ($GeF_4$), does not speedily ablate the $LaB_6$ in 3' from bottom 13', and four side walls 5', 7', 9', 11' as would be the case with bottom 13, and four side walls 5, 7, 9, 11 as discussed with reference to FIG. 1. Since there is far less ablation of chamber 3' in FIG. 2, where it comprises, for example, lanthanum hexaboride ($LaB_6$), chamber 3' has a longer service life and may be reused as such after a small amount of cleaning. Furthermore, very little material is deposited onto cathode 15 and repeller electrode 19, and thus needle crystals 23 do not speedily form. As a result electrons continue to directly emerge from cathode 15 optimally, and the output of ion source 25 remains stable. The lifespan of ion source 25 is thereby significantly longer as compared to ion source 1.

Moreover an inner ionization side base formed of lanthanum hexaboride ($LaB_6$) has a smaller electron emissivity, and the lanthanum hexaboride ($LaB_6$) based chamber appears to amplify the ion stream when compared with traditional materials such as tungsten (W). In this context, amplifying the ion stream is understood to mean to attenuate to a lesser degree, or to enhance or increase the strength or power of the ion stream without a corresponding increase in ionization inputs. An additional advantage of using lanthanum hexaboride ($LaB_6$) based chamber 4 is that the ion stream produced is relatively free of heavy metals, and the danger of contamination due to impurities in the ion stream is noticeably reduced.

FIG. 4 depicts a method for doping a semiconductor according to an aspect of the disclosure. Method 35 for doping a semiconductor includes, 37, ionizing a gas within a chamber of an ion source, the chamber comprising lanthanum hexaboride ($LaB_6$), 39, placing a target semiconductor material in an implantation target area, 41, producing an ion stream with the ion source, 43, aiming the ion stream at the target semiconductor material, and 45, implanting the target semiconductor with ions from the ion stream.

The ion stream is produced such that it is relatively free of heavy metals. Method 35, and ion source 25, for example, can be employed to produce such a stream of ions that is relatively free of heavy metals.

Since little to no ablation occurs within chamber 4 of ion source 25, the ion source tends to produce an ion stream that is relatively pure. That is, an ion stream produced with ion source 25, or in accordance with method 35, tends to be relatively free of heavy metals since ablation of heavy metals is unlikely to occur within chamber 3 of ion source 25. As a result in accordance with an aspect of the disclosure, there is a decreased risk of contaminating semiconductor products manufactured according to method 35.

Similar to the aspects described above, method 35 has proven to be particularly advantageous, for example, when germanium tetrafluoride ($GeF_4$) is applied with ion source 25. The lanthanum hexaboride ($LaB_6$) is not speedily ablated and redeposited within the chamber.

In particular, FIG. 5 compares the increase and decrease in weight of several components between the ion sources described with reference to FIG. 1 and FIG. 2 when using germanium tetrafluoride ($GeF_4$). Specifically, in bar graph 47, the ion source described with reference to FIG. 1 is labeled 'tungsten based chamber', while the ion source described with reference to FIG. 2 and onward is labeled '$LaB_6$ based chamber'. Bar graph 47 includes nine distinct measurements with each measured component showing the $LaB_6$ based chamber measurement as a bar on the left while the tungsten based chamber measurements are shown right.

With regard to side 5 in the bar graph 47, the change of weight of side 5' in the $LaB_6$ based chamber was immeasurably small and is thus not shown. Likewise with repeller electrode 19, the change of weight for the $LaB_6$ based chamber was immeasurably small and is thus not shown. With side 7, the change of weight of side 7 in the tungsten (w) based chamber was immeasurably small and is thus not shown. Cathode 15 and cathode nut 17 are not shown individually, but instead are shown as a combined measurement. The tungsten and $LaB_6$ based chamber were also measured with both graphite and tungsten arc slits, as shown.

Bar graph 47 summarizes an advantage described above with reference to ion source 25 with chamber 4, which is labeled '$LaB_6$ based chamber' in bar graph 39. Specifically, there is little ablation and re-deposition that occurs during operation of an ion source with a $LaB_6$ based chamber.

The embodiments herein thereby enable one of skill in the art to make and use the same the invention, and describe the preferred embodiment of carrying out the invention. The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A method for doping a semiconductor, the method comprising:
    ionizing a gas within a chamber of an ion source, the chamber comprising an electrically conductive ceramic that is resistant to reactions with the gas;
    placing a target semiconductor material in an implantation target area;
    producing an ion stream with the ion source, the ion source including at least one electrode;
    aiming the ion stream at the target semiconductor material; and
    implanting the target semiconductor with ions from the ion stream,
    wherein the electrically conductive ceramic comprises a hexaboride substance,
    for reducing ablation of the chamber and the subsequent deposition of ablated materials on the electrode.

2. The method of claim 1, wherein the ion source comprises:
    an interior cavity for ionization defined by the chamber;
    an electron beam source at a first end of the interior cavity;
    an inlet for introducing an ionizable gas into the chamber; and
    an arc slit for extracting ions from the chamber.

3. The method of claim 1, wherein the ion stream is produced such that it is relatively free of heavy metals.

4. The method of claim 1, wherein the electrically conductive ceramic is lanthanum hexaboride ($LaB_6$).

5. The method of claim 4, wherein the lanthanum hexaboride ($LaB_6$) in the chamber amplifies the ion stream.

6. The method of claim 1, wherein the gas is a halogen gas.

7. The method of claim 6, wherein the halogen gas is germanium tetrafluoride ($GeF_4$).

8. The method of claim 1, wherein the electrically conductive ceramic is selected from the group consisting of: lanthanum hexaboride (LaB6), calcium hexaboride (CaB6), cerium hexaboride (CeB6), and europium hexaboride (EuB6).

9. A method for generating an ion beam, the method comprising:
    energizing an ion source comprising:
        a chamber defining an interior cavity for ionization;
        an electron beam source at a first end of the interior cavity including at least one electrode;
        an inlet for introducing ionizable gas into the chamber; and
        an arc slit for extracting ions from the chamber,
        wherein the chamber comprises an electrically conductive ceramic that is resistant to reactions with the ionizable gas,
        wherein the electrically conductive ceramic comprises a hexaboride substance,
        for reducing ablation of the chamber and the subsequent deposition of ablated materials on the electrode;
    introducing a gas comprising Fluorine (F) into the chamber through the inlet; and
    extracting ions from said arc slit.

10. The method of claim 9, wherein the gas is germanium tetrafluoride ($GeF_4$).

11. The method of claim 9, wherein the chamber is at least partially enveloped by a second material.

12. The method of claim 11, wherein the second material comprises graphite.

13. The method of claim 9, wherein the electrically conductive ceramic is lanthanum hexaboride ($LaB_6$).

14. The method of claim 13, wherein the chamber further comprises a second hexaboride substance.

15. The method of claim 14, wherein the second hexaboride substance is selected from the group consisting of: calcium hexaboride ($CaB_6$), cerium hexaboride ($CeB_6$), and europium hexaboride ($EuB_6$).

16. The method of claim 9, wherein the electron beam source is an electron producing cathode comprising a substance selected from the group consisting of: tungsten (W), molybdenum (Mo), and tantalum (Ta).

17. The method of claim 9, wherein the electrically conductive ceramic is selected from the group consisting of: lanthanum hexaboride (LaB6), calcium hexaboride (CaB6), cerium hexaboride (CeB6), and europium hexaboride (EuB6).

* * * * *